(12) United States Patent
Feng et al.

(10) Patent No.: US 9,553,026 B1
(45) Date of Patent: Jan. 24, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Chao-Hung Lin, Changhua County (TW); Chien-Ting Lin, Hsinchu (TW); Li-Chiang Chen, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/960,447

(22) Filed: Dec. 7, 2015

(30) Foreign Application Priority Data

Nov. 10, 2015 (TW) .............................. 104136926 A

(51) Int. Cl.
| | |
|---|---|
| *H01L 21/30* | (2006.01) |
| *H01L 21/8234* | (2006.01) |
| *H01L 27/11* | (2006.01) |
| *H01L 27/088* | (2006.01) |
| *H01L 21/308* | (2006.01) |
| *H01L 29/66* | (2006.01) |

(52) U.S. Cl.
CPC ... *H01L 21/823431* (2013.01); *H01L 21/3086* (2013.01); *H01L 27/0886* (2013.01); *H01L 27/1104* (2013.01); *H01L 29/6653* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 6,362,057 B1 | 3/2002 | Taylor, Jr. et al. | |
| 8,846,305 B2 | 9/2014 | Kim et al. | |
| 9,449,880 B1* | 9/2016 | Tseng | H01L 21/823431 |
| 9,472,464 B1* | 10/2016 | Zeng | H01L 21/823821 |
| 2013/0309838 A1* | 11/2013 | Wei | H01L 21/823821 438/424 |
| 2013/0330889 A1* | 12/2013 | Yin | H01L 21/823821 438/197 |
| 2015/0056724 A1* | 2/2015 | Shieh | H01L 22/12 438/14 |
| 2016/0071771 A1* | 3/2016 | Colburn | H01L 21/823431 438/283 |

* cited by examiner

*Primary Examiner* — Charles Garber
*Assistant Examiner* — Alia Sabur
(74) *Attorney, Agent, or Firm* — Winston Hsu; Scott Margo

(57) ABSTRACT

A method for fabricating semiconductor device is disclosed. First, a substrate is provided, and a first mandrel, a second mandrel, a third mandrel, and a fourth mandrel are formed on the substrate. Preferably, the first mandrel and the second mandrel include a first gap therebetween, the second mandrel and the third mandrel include a second gap therebetween, and the third mandrel and the fourth mandrel include a third gap therebetween, in which the first gap is equivalent to the third gap but different from the second gap. Next, spacers are formed adjacent to the first mandrel, the second mandrel, the third mandrel, and the fourth mandrel, and the spacers in the first gap and the third gap are removed.

5 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of using sidewall image transfer (SIT) technique to form fin-shaped structures.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to a preferred embodiment of the present invention, a method for fabricating semiconductor device is disclosed. First, a substrate is provided, and a first mandrel, a second mandrel, a third mandrel, and a fourth mandrel are formed on the substrate. Preferably, the first mandrel and the second mandrel include a first gap therebetween, the second mandrel and the third mandrel include a second gap therebetween, and the third mandrel and the fourth mandrel include a third gap therebetween, in which the first gap is equivalent to the third gap but different from the second gap. Next, spacers are formed adjacent to the first mandrel, the second mandrel, the third mandrel, and the fourth mandrel, and the spacers in the first gap and the third gap are removed.

According to another aspect of the present invention, a semiconductor device is disclosed. The semiconductor device includes: a substrate having a static random access memory (SRAM) region defined thereon; and a first fin-shaped structure, a second fin-shaped structure, a third fin-shaped structure, and a fourth fin-shaped structure, in which the first fin-shaped structure and the second fin-shaped structure include a first trench therebetween, the second fin-shaped structure and the third fin-shaped structure include a single bump therebetween, the third fin-shaped structure and the fourth fin-shaped structure include a second trench therebetween.

According to another aspect of the present invention, a semiconductor device is disclosed. The semiconductor device includes: a substrate having a logic region defined thereon; and a first fin-shaped structure, a second fin-shaped structure, a third fin-shaped structure, and a fourth fin-shaped structure, in which the first fin-shaped structure and the second fin-shaped structure include a first trench therebetween, the second fin-shaped structure and the third fin-shaped structure include two bumps therebetween, the third fin-shaped structure and the fourth fin-shaped structure include a second trench therebetween.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
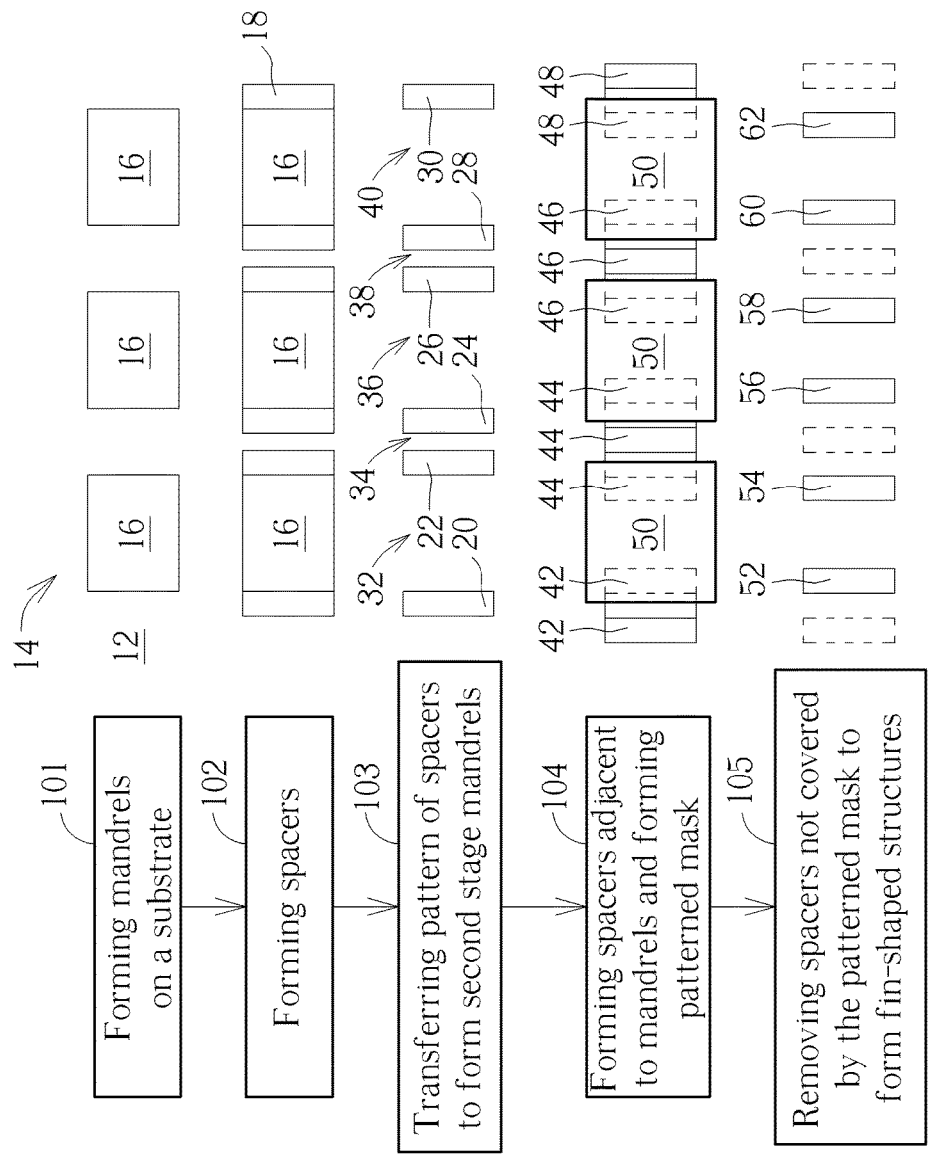
FIG. 1 illustrates a method for fabricating a semiconductor device according to a first embodiment of the present invention.

Referring to FIG. 1, FIG. 1 illustrates a method for fabricating a semiconductor device according to a first embodiment of the present invention, in which the left side of FIG. 1 is a flow chart diagram illustrating the steps for fabricating the semiconductor device and the right side of FIG. 1 illustrates top views for fabricating the semiconductor device. As shown in FIG. 1, a substrate 12, such as a silicon substrate provided, and a static random access memory (SRAM) region 14 is defined on the substrate 12 for fabricating SRAM device afterwards.

Next, step 101 is conducted by forming a plurality of mandrels 16 on the substrate 12. In this embodiment, the fabrication of the mandrels 16 could be accomplished by first forming a material layer (not shown) on the substrate 12, and a pattern transfer process is conducted by using etching to remove part of the material layer for forming a plurality of patterned material layers serving as mandrels 16 on the substrate 12. Preferably, the mandrels 16 could be selected from the group consisting of amorphous silicon, polysilicon, silicon oxide, and silicon nitride, but not limited thereto. Moreover, the mandrels 16 of this embodiment preferably share same widths, and the gaps and pitches between mandrels 16 are preferably equivalent.

Next, step 102 is conducted by forming spacers 18 adjacent to the mandrels 16, in which the spacers 18 could be selected from the group consisting of silicon oxide, silicon nitride, silicon oxynitride (SiON), and silicon carbon nitride (SiCN), but not limited thereto. It should be noted that typically each of the spacers 18 is formed around the entire mandrel 16. However, in order to emphasize the pattern transfer conducted by the spacers 18 in later process, only the spacers 18 formed adjacent to left and right sidewalls of the mandrels 16 are revealed in this embodiment while the spacers 18 disposed on top and bottom sidewalls of the mandrels 16 are omitted.

Next, step 103 is conducted by removing the mandrels 16 completely, and then using the remaining spacers 18 as mask to perform another etching process to remove another material layer (not shown) on the substrate 12 for forming second stage mandrels 20, 22, 24, 26, 28, 30. It should be noted that the second stage mandrels 20, 22, 24, 26, 28, 30 are transferred from the patterns of the spacers 18, the quantity of the mandrels 20, 22, 24, 26, 28, 30 and parameters including widths and distance between mandrels 20, 22, 24, 26, 28, 30 are equivalent to the parameters of the spacers 18. The spacers 18 could then be removed selectively.

In this embodiment, a gap 32 is between mandrel 20 and mandrel 22, a gap 34 is between mandrel 22 and mandrel 24, a gap 36 is between mandrel 24 and mandrel 26, a gap 38 is between mandrel 26 and mandrel 28, a gap 40 is between mandrel 28 and mandrel 30, in which the distance or width of the gap 32 is equal to the distances or widths of the gaps 36 and 40, the distance of gap 34 is equal to the distance of gap 38, but the distance of gaps 32, 36, 40 is different from the distance of gaps 34, 38.

Next, step 104 is conducted by forming spacers 42, 44, 46, 48 adjacent to the mandrels 20, 22, 24, 26, 28, 30, including forming spacer 42 adjacent to two sides of the mandrel 20, forming spacer 44 adjacent to the mandrels 22, 24 and between mandrel 22 and mandrel 24, forming spacer 46 adjacent to mandrels 26, 28 and between mandrel 26 and mandrel 28, and forming spacer 48 adjacent to two sides of mandrel 30. Next, a patterned mask 50, such as a patterned resist is formed to cover the spacers 42 and 44 between mandrels 20 and 22, spacers 44 and 46 between mandrels 24 and 26, and spacers 46 and 48 between mandrels 28 and 30.

Next, step 105 is conducted by removing spacers 42, 44, 46, 48 not covered by the patterned mask 50, including the spacer 42 adjacent to mandrel 20, the spacer 44 between mandrels 22 and 24, the spacer 46 between mandrels 26 and 28, and the spacer 48 adjacent to mandrel 30. It should be noted that a negative developing process is preferably conducted to remove the spacers 42, 44, 46, 48, hence after an exposure process is conducted on the patterned mask 50 or resist material, the un-exposed spacers 42, 44, 46, 48 are removed by organic developer. By using this approach a much finer resolution could be achieved.

After removing part of the spacers 42, 44, 46, 48 by negative development technique, the mandrels 20, 22, 24, 26, 28, 30 are removed, and the pattern of the remaining spacers or spacers 42, 44, 46, 48 that were covered by patterned mask 50 is transferred to the substrate 12, and a fin-cut process is conducted to cut the ring-shaped fin-shaped structures into linear shaped fin-shaped structures 52, 54, 56, 58, 60, 62.

Figure 2:
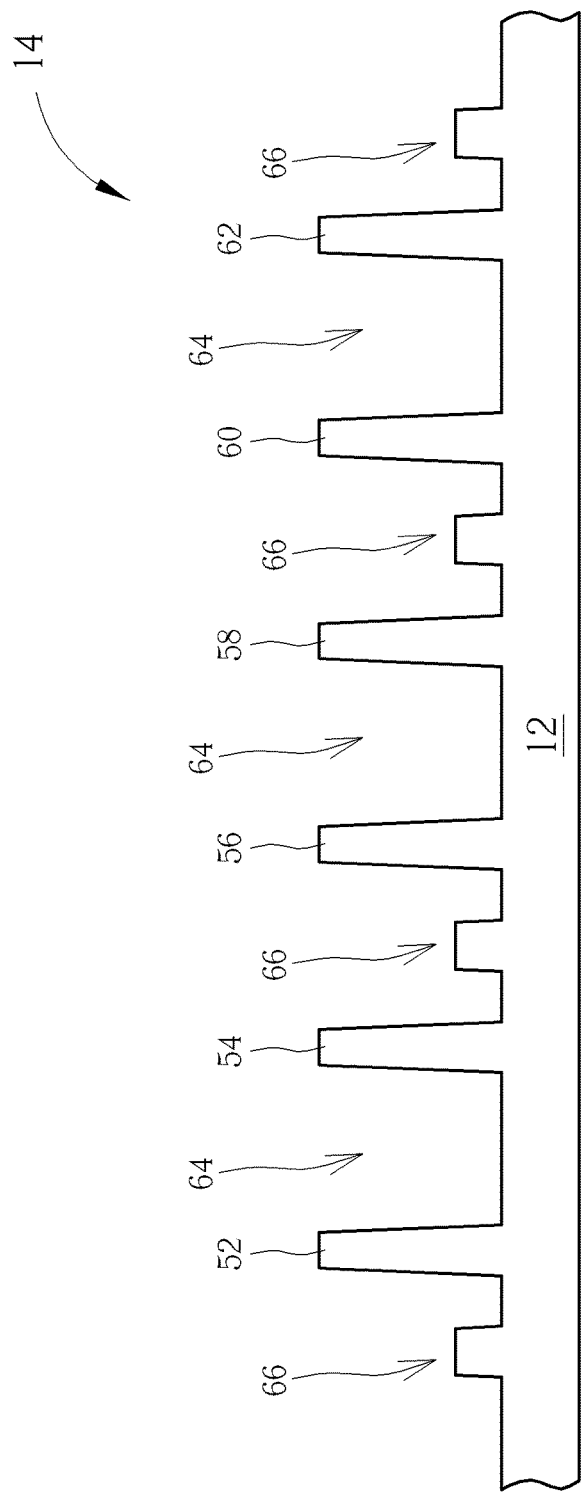
FIG. 2 illustrates a structural view of a semiconductor device according to a first embodiment of the present invention.

Referring to FIG. 2, FIG. 2 illustrates a cross-sectional view of a semiconductor device from FIG. 1 after fin-shaped structures are formed. As shown in FIG. 2, the semiconductor device includes a substrate 12, a SRAM region 14 defined on the substrate 12, and a plurality of fin-shaped structures 52, 54, 56, 58, 60, 62 on the substrate 12. Preferably, the distances or widths, gaps, and pitches between the fin-shaped structures 52, 54, 56, 58, 60, 62 are the same, and a design of interchanging a trench and a single bump between fin-shaped structures 52, 54, 56, 58, 60, 62 is also observed.

For instance, a trench 64 is between fin-shaped structure 52 and fin-shaped structure 54, a single bump 66 is between fin-shaped structure 54 and fin-shaped structure 56, a trench 64 is between fin-shaped structure 56 and fin-shaped structure 58, a single bump 66 is between fin-shaped structure 58 and fin-shaped structure 60, a trench 64 is between fin-shaped structure 60 and fin-shaped structure 62, and a single bump 66 is between fin-shaped structure and another adjacent fin-shaped structure (not shown). If comparing with the pattern transfer of spacers 42, 44, 46, 48 into fin-shaped structures 52, 54, 56, 58, 60, 62 on right side of FIG. 1, the trenches 64 between fin-shaped structures 52, 54, 56, 58, 60, 62 are essentially the gaps or distances between spacers 42 and 44, spacers 44 and 46, and spacers 46 and 48, and the bumps 66 being the remaining positions of the spacers 42, 44, 46, 48 removed by the aforementioned negative developing process, or the dotted portions shown in the bottom right hand side of FIG. 1.

After the fin-shaped structures 52, 54, 56, 58, 60, 62 are formed, shallow trench isolation (STI) could be formed around the fin-shaped structures 52, 54, 56, 58, 60, 62, and transistor elements such as gate structures and source/drain regions could be formed on the fin-shaped structures 52, 54, 56, 58, 60, 62. It should be noted that even though this embodiment is preferably applied to the fabrication of fin-shaped structures, however, the aforementioned processes could also be applied to the fabrication of other relating semiconductor devices, such as fabrication of gate lines, which is also within the scope of the present invention.

Figure 3:
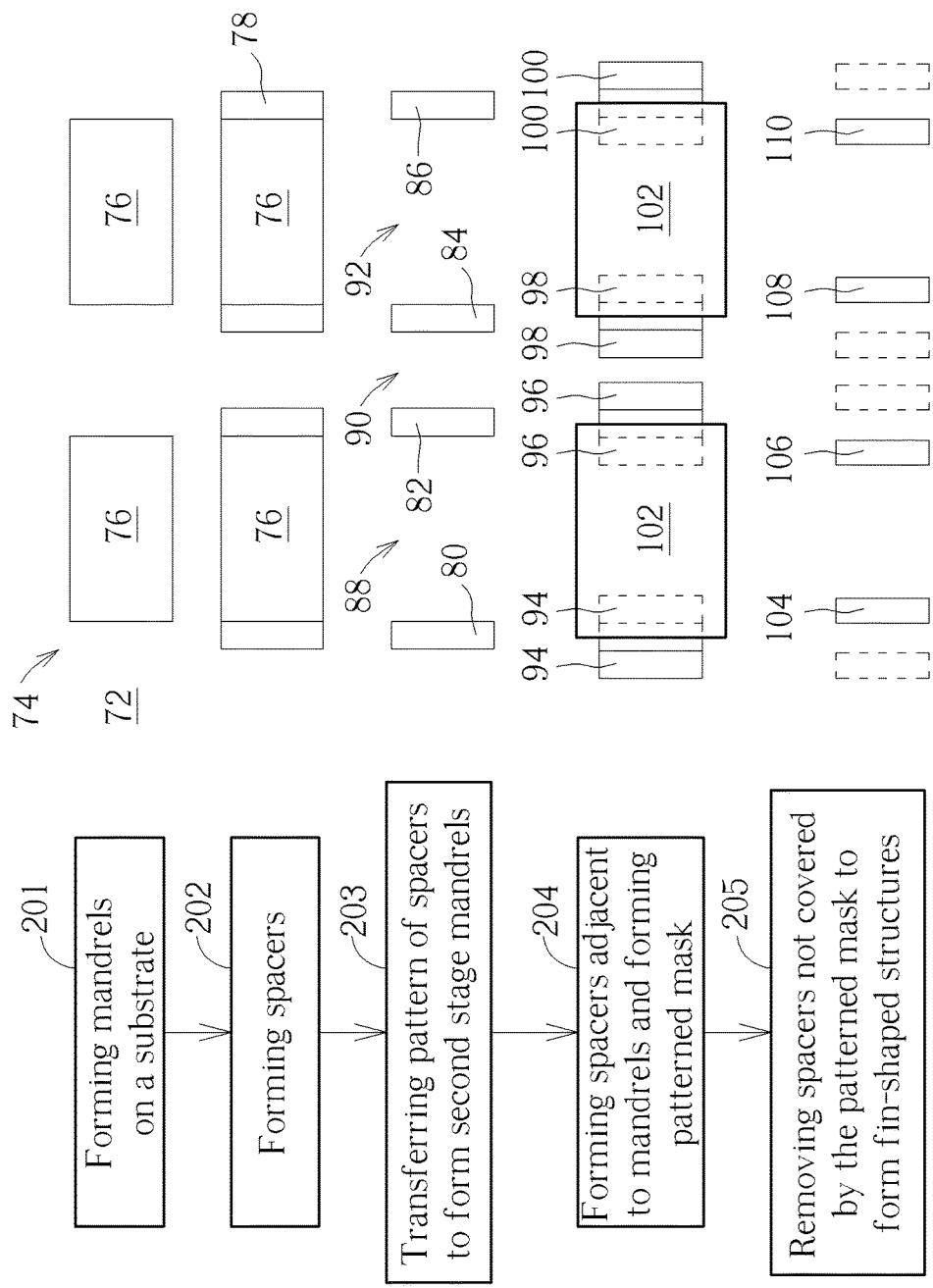
FIG. 3 illustrates a method for fabricating a semiconductor device according to a second embodiment of the present invention.

Referring to FIG. 3, FIG. 3 illustrates a method for fabricating a semiconductor device according to a second embodiment of the present invention, in which the left side of FIG. 3 is a flow chart diagram illustrating the steps for fabricating the semiconductor device and the right side of FIG. 3 illustrates top views for fabricating the semiconductor device. As shown in FIG. 3, a substrate 72, such as a silicon substrate provided, and a logic region 74 is defined on the substrate 72 for fabricating logic device or active device afterwards.

Next, step 201 is conducted by forming a plurality of mandrels 76 on the substrate 72. In this embodiment, the fabrication of the mandrels 76 could be accomplished by first forming a material layer (not shown) on the substrate 72, and a pattern transfer process is conducted by using etching to remove part of the material layer for forming a plurality of patterned material layers serving as mandrels 76 on the substrate 72. Preferably, the mandrels 76 could be selected from the group consisting of amorphous silicon, polysilicon, silicon oxide, and silicon nitride, but not limited thereto. Moreover, the mandrels 76 of this embodiment preferably share same widths.

Next, step 202 is conducted by forming spacers 78 adjacent to the mandrels 76, in which the spacers 78 could be selected from the group consisting of silicon oxide, silicon nitride, silicon oxynitride (SiON), and silicon carbon nitride (SiCN), but not limited thereto. It should be noted that typically each of the spacers 78 is formed around the entire mandrel 76. However, in order to emphasize the pattern transfer conducted by the spacers 78 in later process, only the spacers 78 formed adjacent to left and right sidewalls of the mandrels 76 are shown in this embodiment while the spacers 78 disposed on top and bottom sidewalls of the mandrels 76 are omitted.

Next, step 203 is conducted by removing the mandrels 76 completely, and then using the remaining spacers 78 as mask to perform another etching process to remove another material layer (not shown) on the substrate 72 for forming second stage mandrels 80, 82, 84, 86. It should be noted that the second stage mandrels 80, 82, 84, 86 are transferred from the patterns of the spacers 78, the quantity of the mandrels 80, 82, 84, 86 and parameters including widths and distance between mandrels 80, 82, 84, 86 are equivalent to the parameters of the spacers 78. The spacers 78 could then be removed selectively.

In this embodiment, a gap 88 is between mandrel 80 and mandrel 82, a gap 90 is between mandrel 82 and mandrel 84, a gap 92 is between mandrel 84 and mandrel 86, in which the distance or width of the gap 88 is equal to the distance or width of the gap 92 but different from the distance of the gap 90.

Next, step 204 is conducted by forming spacers 94, 96, 98, 100 adjacent to the mandrels 80, 82, 84, 86, including forming spacer 94 adjacent to two sides of the mandrel 80, forming spacer 96 adjacent to two sides of the mandrel 82, forming spacer 98 adjacent to two sides of the mandrel 84, and forming spacer 100 adjacent to two sides of the mandrel 86. Next, a patterned mask 102, such as a patterned resist is formed to cover the spacers 94 and 96 between mandrels 80 and 82 and spacers 98 and 100 between mandrels 84 and 86.

Next, step 205 is conducted by removing spacers 94, 96, 98, 100 not covered by the patterned mask 102, including part of the spacer 94 adjacent to mandrel 80, part of the spacer 96 adjacent to the mandrel 82, part of the spacer 98 adjacent to the mandrel 84, and part of the spacer 100 adjacent to the mandrel 86. Similar to the first embodiment, a negative developing process is preferably conducted to remove the spacers 94, 96, 98, 100, hence after an exposure process is conducted on the patterned mask 102 or resist material, the un-exposed spacers 94, 96, 98, 100 are removed by organic developer. By using this approach a much finer resolution could be achieved.

After removing part of the spacers 94, 96, 98, 100 by negative development technique, the mandrels 80, 82, 84, 86 are removed, and the pattern of the remaining spacers or spacers 94, 96, 98, 100 that were covered by patterned mask 102 is transferred to the substrate 72, and a fin-cut process is conducted to cut the ring-shaped fin-shaped structures into linear shaped fin-shaped structures 104, 106, 108, 110.

Figure 4:
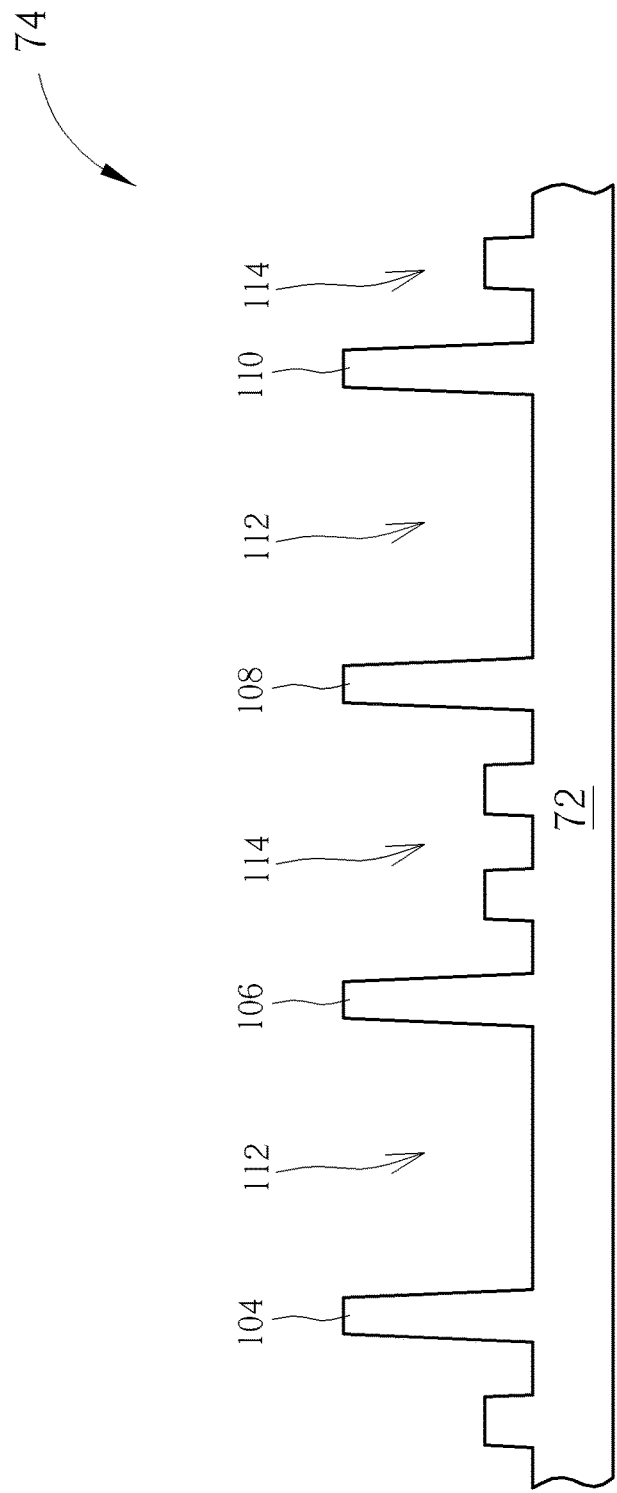
FIG. 4 illustrates a structural view of a semiconductor device according to a second embodiment of the present invention.

Referring to FIG. 4, FIG. 4 illustrates a cross-sectional view of a semiconductor device from FIG. 3 after fin-shaped structures are formed. As shown in FIG. 4, the semiconductor device includes a substrate 72, a logic region 74 defined on the substrate 72, and a plurality of fin-shaped structures 104, 106, 108, 110 on the substrate 72. Preferably, the distances or widths, gaps, and pitches between the fin-shaped structures 104, 106, 108, 110 are the same, and a design of interchanging a trench and two bumps between fin-shaped structures 104, 106, 108, 110 is revealed.

Specifically, a trench 112 is between fin-shaped structure 104 and fin-shaped structure 106, two bumps 114 are between fin-shaped structure 106 and fin-shaped structure 108, a trench 112 is between fin-shaped structure 108 and fin-shaped structure 110, and two bumps 114 (only one bump is shown in FIG. 4) are between fin-shaped structure 110 and another adjacent fin-shaped structure (not shown). If comparing with the pattern transfer of spacers 94, 96, 98, 48 into fin-shaped structures 104, 106, 108, 110 on right side of FIG. 3, the trenches 112 between fin-shaped structures 104, 106, 108, 110 are essentially the gaps or distances between spacers 94, 96 and spacers 98, 100, and the bumps 114 being the remaining positions of the spacers 94, 96, 98, 100 removed by the aforementioned negative developing process, or the dotted portions shown in the bottom right hand side of FIG. 3.

Similar to the aforementioned embodiment, after the fin-shaped structures 104, 106, 108, 110 are formed, shallow trench isolation (STI) could be formed around the fin-shaped structures 104, 106, 108, 110, and transistor elements such as gate structures and source/drain regions could be formed on the fin-shaped structures 104, 106, 108, 110. It should be noted that even though this embodiment is preferably applied to the fabrication of fin-shaped structures, however, the aforementioned processes could also be applied to the fabrication of other relating semiconductor devices, such as fabrication of gate lines, which is also within the scope of the present invention.

Overall, the present invention discloses an approach of using SIT technique to form different combinations of fin-shaped structures with bumps on a substrate, in which the design combination of fin-shaped structures and bumps could be vary depending on the type of device being fabricated. According to the first embodiment of the present invention, if a SRAM device were to be formed, a design of alternating a trench and a single bump between fin-shaped structures is employed. According to the second embodiment of the present invention, if a logic device were to be formed, a design of alternating a trench and two bumps between fin-shaped structures is preferably utilized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
providing a substrate;
forming a first mandrel, a second mandrel, a third mandrel, and a fourth mandrel on the substrate, the first mandrel and the second mandrel comprise a first gap therebetween, the second mandrel and the third mandrel comprise a second gap therebetween, and the third mandrel and the fourth mandrel comprise a third gap therebetween, wherein the first gap is equivalent to the third gap but different from the second gap;
forming a first spacer adjacent to the first mandrel, a single second spacer between the second mandrel and the third mandrel, and a third spacer adjacent to the fourth mandrel, wherein a width of the single second spacer between the second mandrel and the third mandrel is equal to a width of the first spacer adjacent to one side of the first mandrel; and
removing the single second spacer in the second gap.

2. The method of claim 1, wherein the step of forming the spacers comprises:
forming a first spacer adjacent to the first mandrel, a second spacer adjacent to the second mandrel and the third mandrel and between the second mandrel and the third mandrel, and a third spacer adjacent to the fourth mandrel.

3. The method of claim 2, further comprising:
forming a patterned mask on the first spacer between the first mandrel and the second mandrel, the second spacer between the first mandrel and the second mandrel, the second spacer between the third mandrel and the fourth mandrel, and the third spacer between the third mandrel and the fourth mandrel;
removing part of the first spacer, part of the second spacer, and part of the third spacer not covered by the patterned mask;
removing the first mandrel, the second mandrel, the third mandrel, and the fourth mandrel; and
transferring the patterns of the first spacer between the first mandrel and the second mandrel, the second spacer between the first mandrel and the second mandrel, the second spacer between the third mandrel and the fourth mandrel, and the third spacer between the third mandrel and the fourth mandrel to the substrate.

4. A semiconductor device, comprising:

a substrate having a static random access memory (SRAM) region defined thereon; and a first fin-shaped structure, a second fin-shaped structure, a third fin-shaped structure, a fourth fin-shaped structure, and a fifth fin-shaped structure, wherein the first fin-shaped structure and the second fin-shaped structure comprise a first trench therebetween, the second fin-shaped structure and the third fin-shaped structure comprise a single first partial fin therebetween, the third fin-shaped structure and the fourth fin-shaped structure comprise a second trench therebetween, the fourth fin-shaped structure and the fifth fin-shaped structure comprise a single second partial fin therebetween, and the first fin-shaped structure, the second fin-shaped structure, the third fin-shaped structure, and the fourth fin-shaped structure comprise same pitch.

5. A semiconductor device, comprising:

a substrate having a logic region defined thereon; and a first fin-shaped structure, a second fin-shaped structure, a third fin-shaped structure, and a fourth fin-shaped structure, wherein the first fin-shaped structure and the second fin-shaped structure comprise a first trench therebetween, the second fin-shaped structure and the third fin-shaped structure comprise two partial fins therebetween, the third fin-shaped structure and the fourth fin-shaped structure comprise a second trench therebetween, and the first fin-shaped structure, the second fin-shaped structure, the third fin-shaped structure, and the fourth fin-shaped structure comprise same pitch.

\* \* \* \* \*